(12) United States Patent
Liu et al.

(10) Patent No.: US 8,278,132 B2
(45) Date of Patent: Oct. 2, 2012

(54) IMAGE SENSOR AND FABRICATING METHOD THEREOF

(75) Inventors: Chih-Min Liu, Grand Cayman (KY); Fang-Ming Huang, Grand Cayman (KY); Ping-Hung Yin, Grand Cayman (KY); Kuo-Chan Huang, Grand Cayman (KY); Chung-Wei Chang, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 387 days.

(21) Appl. No.: 12/781,825

(22) Filed: May 18, 2010

(65) Prior Publication Data
US 2011/0284984 A1 Nov. 24, 2011

(51) Int. Cl.
*H01L 21/00* (2006.01)

(52) U.S. Cl. .......... 438/64; 438/29; 438/48; 438/60; 438/66; 438/70; 257/433; 257/443; 257/444; 257/460; 257/E21.476

(58) Field of Classification Search .................. None
See application file for complete search history.

(56) References Cited

U.S. PATENT DOCUMENTS

2008/0290525 A1* 11/2008 Anderson et al. ............. 257/774
* cited by examiner

*Primary Examiner* — Kyoung Lee
(74) *Attorney, Agent, or Firm* — Winston Hsu; Scott Margo

(57) ABSTRACT

The present invention provides an image sensor and a fabricating method thereof capable of approaching higher quantum efficiency and reducing cost. The method comprises: providing a substrate; forming a pixel region on a top surface of the substrate; forming an interlayer insulating layer and at least a metal line on the pixel region; forming an isolation carrier layer having a hole array therein on the interlayer insulating layer; grinding a lower surface of the substrate to reduce the thickness of the substrate; placing a plurality of conductors into the hole array to form a plurality of bumps on the isolation carrier layer.

15 Claims, 8 Drawing Sheets

IMAGE SENSOR AND FABRICATING METHOD THEREOF

BACKGROUND OF THE INVENTION

1. Field of the Invention

The present invention relates to an image sensor and a fabricating method thereof, and more particularly, to a back side illumination (BSI) image sensor and a fabricating method thereof.

2. Description of the Prior Art

Please refer to FIG. 1. FIG. 1 shows a cross-sectional view of a conventional front side illumination (FSI) image sensor 100. As shown in FIG. 1, the FSI image sensor 100 comprises: a carrier board 110, a substrate 120, a pixel region 130, an interlayer insulating layer 140, metal lines 150, an isolation layer 160, and a bond wire 170. The light collection path must pass through the interlayer insulating layer 140 and the metal lines 150, which reflect the light and makes quantum efficiency worse. The circuit routing also blocks the light so the fill factor is limited, especially when photo diode area becomes smaller in advanced technology.

Please refer to FIG. 2. FIG. 2 shows a cross-sectional view of a conventional back side illumination (BSI) image sensor 200. As shown in FIG. 2, the BSI image sensor 200 comprises: a carrier board 210, a substrate 220, a pixel region 230, an interlayer insulating layer 240, metal lines 250, an isolation layer 260, and a bond wire 270. The light collection path passes through the substrate 220, and thus the BSI image sensor 200 can achieve higher fill factor because no circuit routing blocks the light. The quantum efficiency may not be good enough if the substrate 220 is thick, and thus a traditional solution is using a polish process to make the substrate 220 thin. However, the polish process costs higher and spends more time, and it is not easy to exactly control the stop timing of the polish process. Additionally, the isolation layer 260 of a special shell package type must be used as a contact interface to the carrier board 210 since the substrate 220 is thin. The isolation layer 260 of the special shell package type and the bond wire 270 cause waste of die area.

SUMMARY OF THE INVENTION

It is therefore one of the objectives of the present invention to provide an image sensor and a fabricating method thereof capable of approaching higher quantum efficiency and reducing cost, so as to solve the above problem.

According to an embodiment of the present invention, a method of fabricating an image sensor is disclosed. The method comprises: providing a substrate; forming a pixel region on a top surface of the substrate; forming an interlayer insulating layer and at least a metal line on the pixel region; forming an isolation carrier layer having a hole array therein on the interlayer insulating layer; grinding a lower surface of the substrate to reduce the thickness of the substrate; placing a plurality of conductors into the hole array to form a plurality of bumps on the isolation carrier layer.

According to an embodiment of the present invention, an image sensor is disclosed. The image sensor comprises: an isolation carrier layer, an interlayer insulating layer, at least a metal line, and a pixel region. The isolation carrier layer has a hole array and a plurality of conductors filled in the hole array to act as a plurality of bumps. The interlayer insulating layer and at least a metal line are positioned on the isolation carrier layer. The pixel region is positioned on the interlayer insulating layer and the metal line.

Briefly summarized, the image sensor and the fabricating method thereof of the present invention can approach higher quantum efficiency and reduce cost.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . .".

Figure 1:
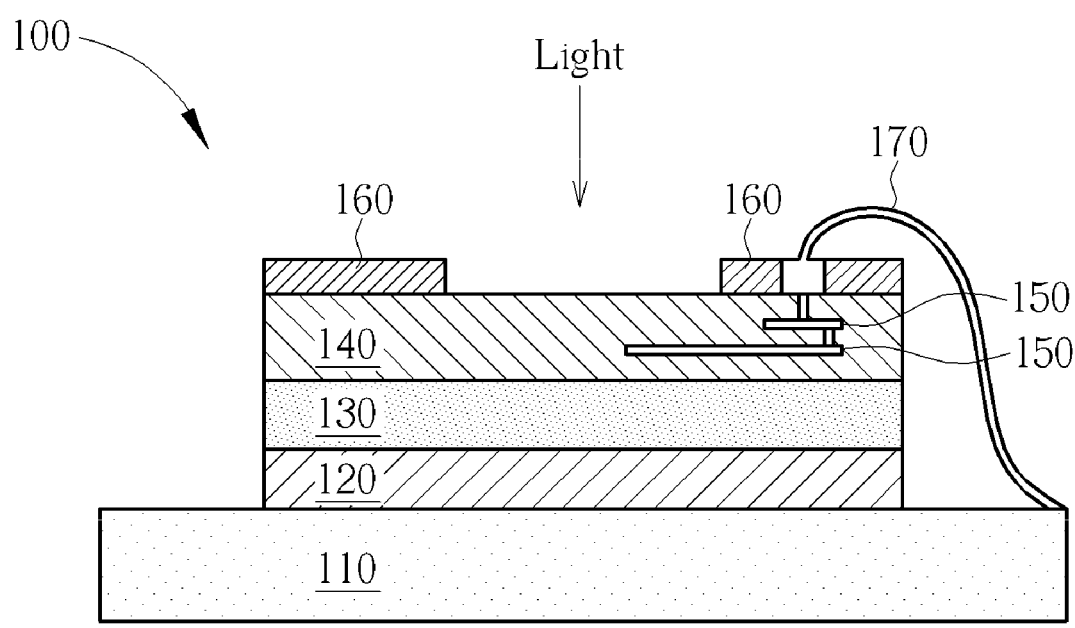
FIG. 1 shows a cross-sectional view of a conventional front side illumination (FSI) image sensor.
Figure 2:
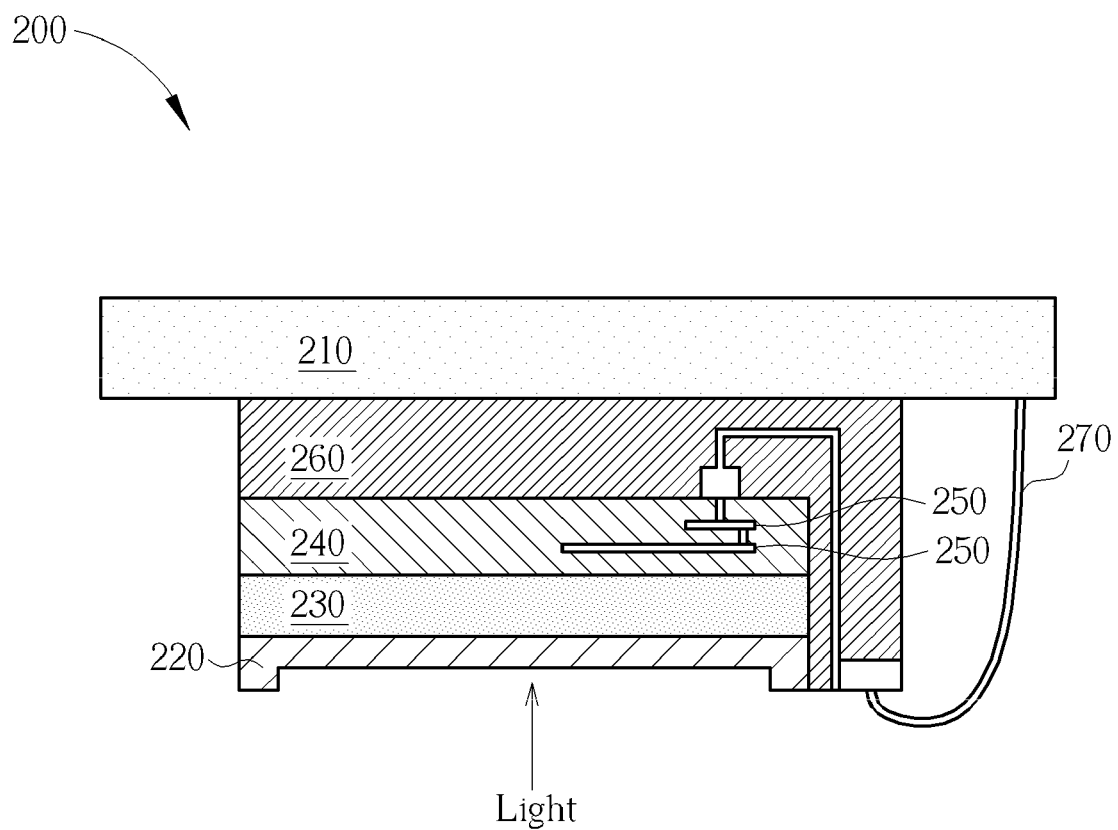
FIG. 2 shows a cross-sectional view of a conventional back side illumination (BSI) image sensor.
Figure 3:
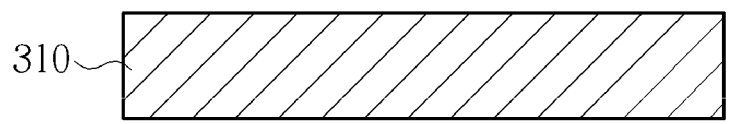
FIG. 3 to FIG. 11 show schematic diagrams illustrating a fabricating method of an image sensor according to an embodiment of the present invention.
Figure 4:
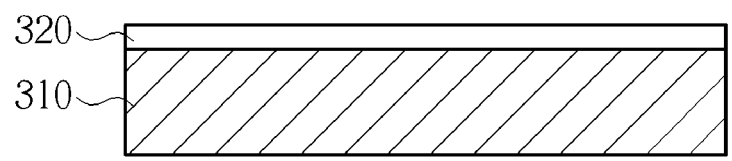
Figure 5:
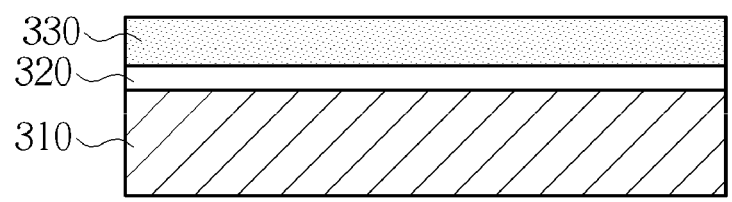

Please refer to FIG. 3 to FIG. 11. FIG. 3 to FIG. 11 show schematic diagrams illustrating a fabricating method of an image sensor 300 according to an embodiment of the present invention. The image sensor 300 is a back side illumination (BSI) image sensor. As shown in FIG. 3, the present invention firstly provides a substrate 310. Next, as shown in FIG. 4, the fabricating method of the present invention forms a stop layer 320 on a top surface of the substrate 310. The stop layer 320 may be very thin, and may be a SiO2 layer. Next, as shown in FIG. 5, the fabricating method forms a pixel region 330 on the stop layer 320. The pixel region 330 for example includes photodiodes and sensor circuits, not shown in the figures.

Figure 6:
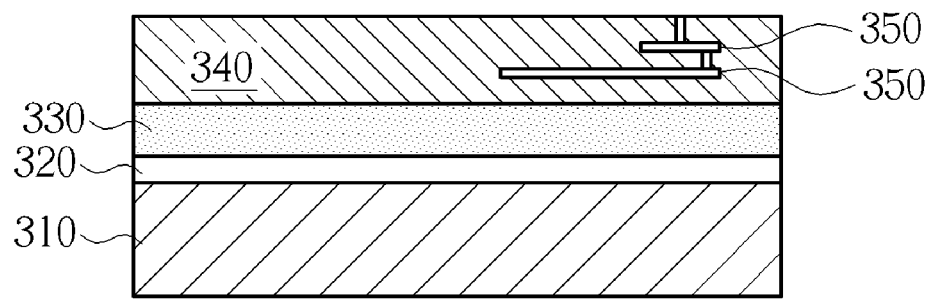
Figure 7:
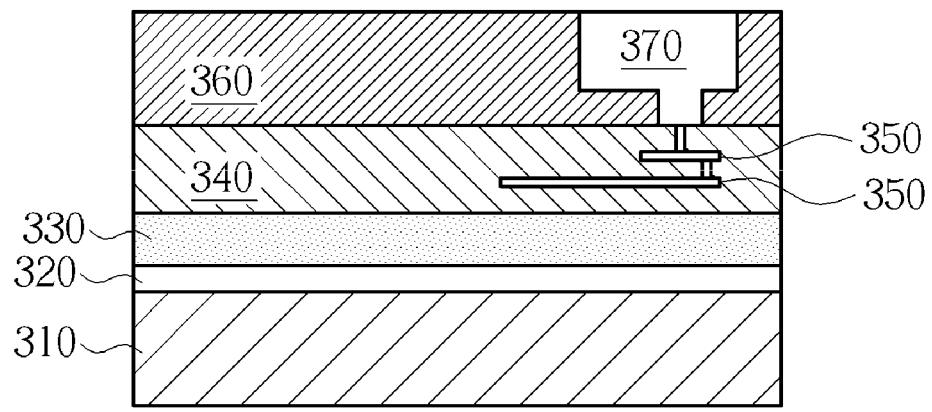
Figure 8:
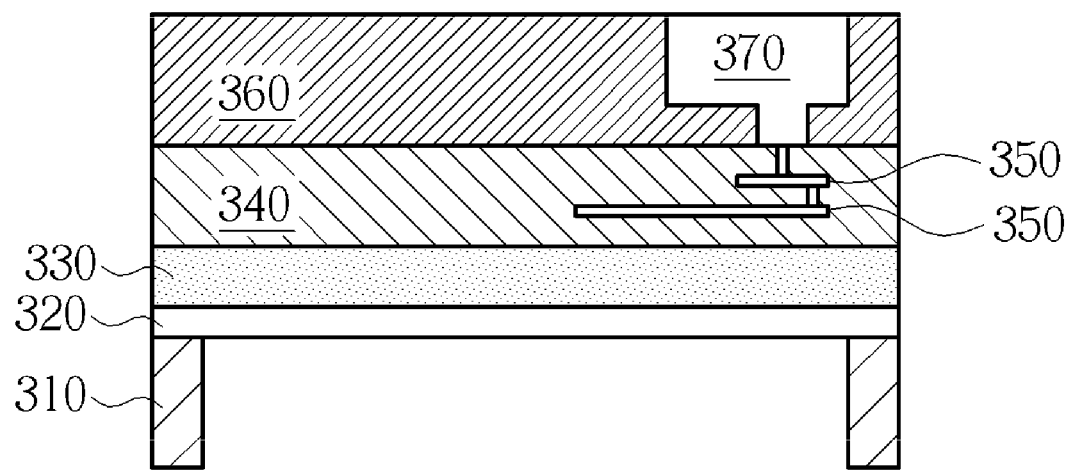

Next, as shown in FIG. 6, the fabricating method forms an interlayer insulating layer 340 and metal lines 350 on the pixel region 330. Next, as shown in FIG. 7, the fabricating method forms an isolation carrier layer 360 having a hole array 370 therein on the interlayer insulating layer 340. Next, as shown in FIG. 8, the fabricating method grinds a lower side of the substrate 310 until the stop layer 320 is exposed. The carrier layer 360 provides support for the substrate 310, at least during the grinding and later fabricating steps. It should be noted that the substrate 310 can be grinded to form side walls as shown in FIG. 8, or that the substrate 310 can be grinded as a whole, without forming the side walls. The carrier layer 360 with the hole array 370 may be made separately, and then attached onto the interlayer insulating layer 340.

Figure 9:
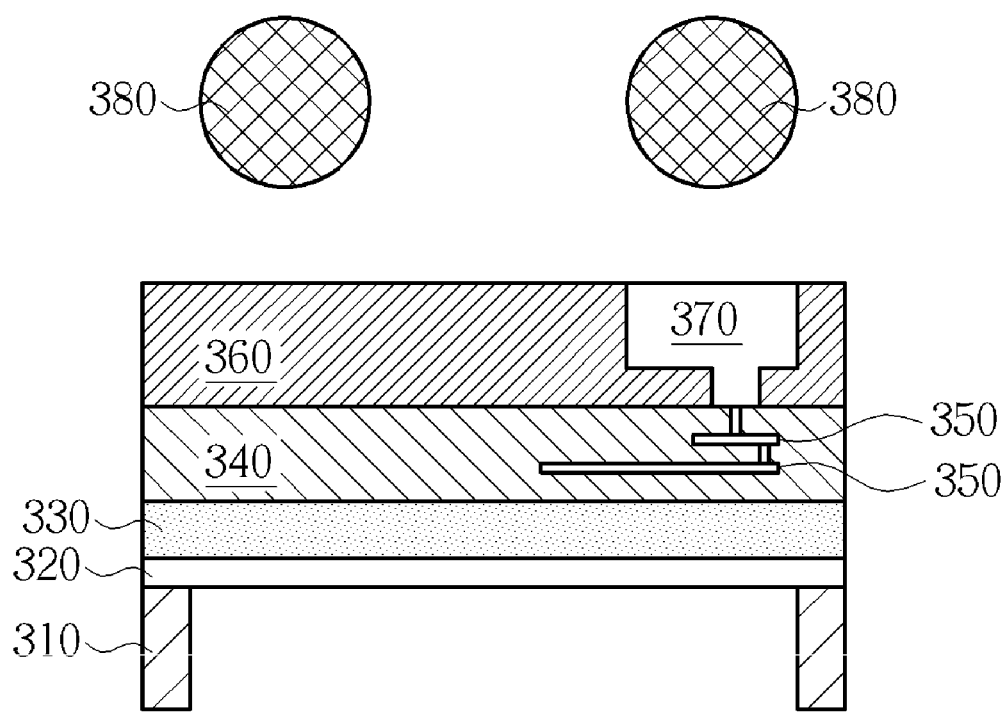
Figure 10:
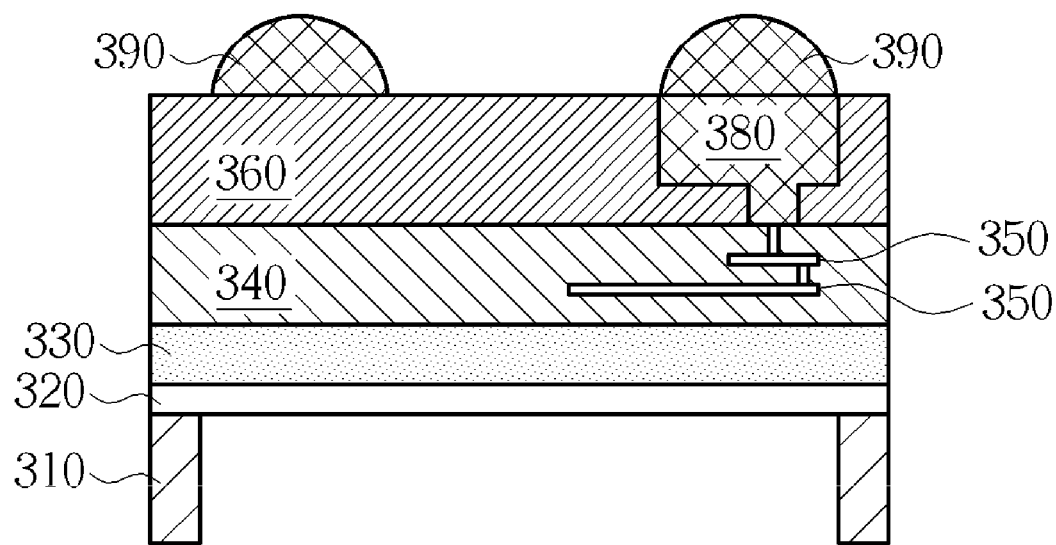
Figure 11:
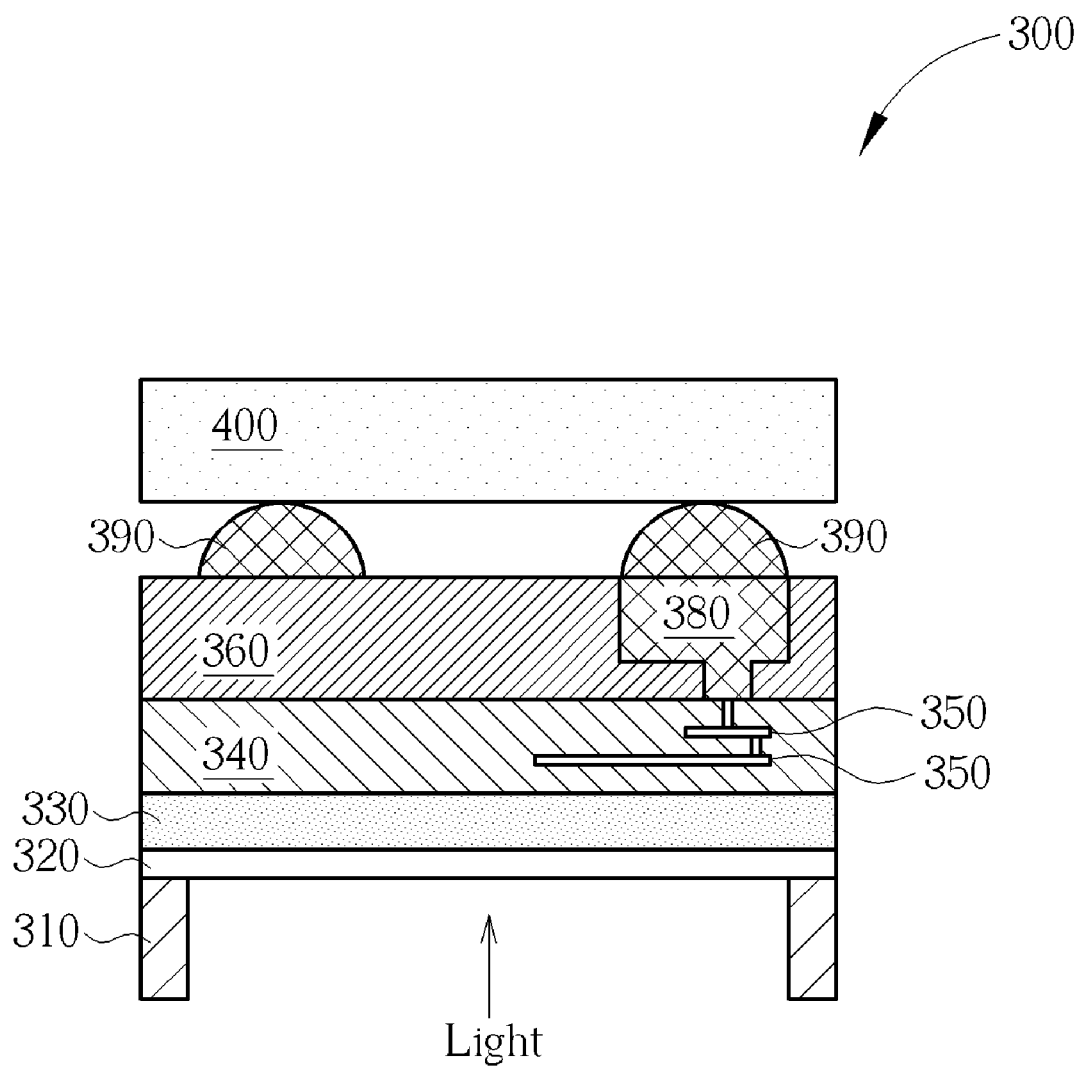

Next, as shown in FIG. 9 and FIG. 10, the fabricating method places a plurality of conductors 380 into the hole array 370 to form a plurality of bumps 390 on the isolation carrier layer 360. The conductors 380 can be metal balls. Next, as shown in FIG. 11, the fabricating method of the present invention bonds a carrier board 400 to the bumps 390, so that the sensor circuits can be electrically connected to the carrier board 400 via the metal lines, the hole a array 370, and the bumps 390. The carrier board 400 can be a printed circuit board (PCB).

In this way, light penetrates through the thin stop layer to reach the photodiodes, and thus the aperture rate is high. The carrier layer with the hole array simplifies packaging process, without bond wires. The stop layer controls the grinding to reach a desired thickness. Briefly summarized, the image sensor and the fabricating method thereof disclosed can approach higher quantum efficiency and reduce cost.

Those skilled in the art will readily observe that numerous modifications and alterations of the device and method may be made while retaining the teachings of the invention.

What is claimed is:

1. A fabricating method of an image sensor, comprising:
   providing a substrate;
   forming a pixel region on a top surface of the substrate;
   forming an interlayer insulating layer and at least a metal line on the pixel region;
   forming an isolation carrier layer having a hole array therein on the interlayer insulating layer;
   grinding a lower surface of the substrate to reduce the thickness of the substrate; and
   placing a plurality of conductors into the hole array to form a plurality of bumps on the isolation carrier layer.

2. The fabricating method of claim 1, wherein the stop layer is a SiO$_2$ layer.

3. The fabricating method of claim 1, wherein the conductors are metal balls.

4. The fabricating method of claim 1, further comprising a step of bonding the bumps to a printed circuit board (PCB).

5. The fabricating method of claim 1, wherein the metal line is electrically connected to the bumps through the hole array.

6. The fabricating method of claim 1, further comprising a step of forming a stop layer on the top surface of the substrate after providing the substrate, and the pixel region is formed on the stop layer.

7. The fabricating method of claim 6, wherein the grinding step grinds the lower surface of the substrate until reaching the stop layer.

8. The fabricating method of claim 1, wherein the image sensor is a back side illumination (BSI) image sensor.

9. An image sensor, comprising:
   an isolation carrier layer, having a hole array and a plurality of conductors filled in the hole array to act as a plurality of bumps;
   an interlayer insulating layer and at least a metal line, positioned on the isolation carrier layer; and
   a pixel region, positioned on the interlayer insulating layer and the metal line.

10. The image sensor of claim 9, further comprising a printed circuit board (PCB) bonded to the bumps.

11. The image sensor of claim 9, further comprising:
    a stop layer, positioned on the pixel region; and
    a substrate, positioned on the stop layer, having an opening to expose the stop layer.

12. The image sensor of claim 9, wherein the metal line is electrically connected to the bumps through the hole array.

13. The image sensor of claim 9, wherein the stop layer is a SiO2 layer.

14. The image sensor of claim 9, wherein the conductors are metal balls.

15. The image sensor of claim 9, being a back side illumination (BSI) image sensor.

* * * * *